(12) United States Patent
Chan

(10) Patent No.: US 6,274,459 B1
(45) Date of Patent: Aug. 14, 2001

(54) METHOD FOR NON MASS SELECTED ION IMPLANT PROFILE CONTROL

(75) Inventor: Chung Chan, Newton, MA (US)

(73) Assignee: Silicon Genesis Corporation, Campbell, CA (US)

( * ) Notice: Subject to any disclaimer, the term of this patent is extended or adjusted under 35 U.S.C. 154(b) by 0 days.

(21) Appl. No.: 09/250,696

(22) Filed: Feb. 16, 1999

Related U.S. Application Data

(60) Provisional application No. 60/074,944, filed on Feb. 17, 1998.

(51) Int. Cl.[7] .................................................. H01L 21/322
(52) U.S. Cl. .......................... 438/475; 438/458; 438/473; 438/474; 118/723 ER
(58) Field of Search ..................... 438/513, 514, 438/423, 455, 458, 795, 798, 162, 692, 475, 473, 474; 118/723 ER

(56) References Cited

U.S. PATENT DOCUMENTS

| | | | |
|---|---|---|---|
| 4,384,938 | * | 5/1983 | Desilets et al. . |
| 4,392,932 | * | 7/1983 | Harra . |
| 4,808,546 | | 2/1989 | Moniwa et al. ........................ 437/41 |
| 5,183,775 | | 2/1993 | Levy ....................................... 437/60 |
| 5,196,355 | | 3/1993 | Wittkower .............................. 437/24 |

(List continued on next page.)

FOREIGN PATENT DOCUMENTS

| | | |
|---|---|---|
| 3-19218 | 1/1991 | (JP) . |
| 3-268444 | 11/1991 | (JP) . |
| WO 93/18201 | 9/1993 | (WO) . |

OTHER PUBLICATIONS

Proposal No. UCB/ERL–93/19, Jun. 6, 1993–Jun. 5, 1996, Chenming Hu and Michael A. Lieberman (Sep. 1992).

Low Energy Separation by Implantation of Oxygen Structure via Plasma Source Ion Implantation, L. Zhang, et al Appl. Phys. Lett. 65 (8) Aug. 1994.

*Primary Examiner*—Charles Bowers
*Assistant Examiner*—Stephen W. Smoot
(74) *Attorney, Agent, or Firm*—Townsend and Townsend and Crew LLP

(57) ABSTRACT

A method for implanting a substrate face using a plasma processing apparatus (10). The method includes providing a substrate (e.g., wafer, panel) (22) on a face of a susceptor. The substrate has an exposed face, which has a substrate diameter that extends from a first edge of the substrate to a second edge of the substrate across a length of the substrate. The method also includes forming a plasma sheath (26) around the face of the substrate. The plasma sheath has a dark space distance "D" that extends in a normal manner from the exposed face to an edge of the plasma sheath. The dark space distance and the substrate diameter comprise a ratio between the dark space distance and the substrate diameter. The ratio is about one half and less, which provides a substantially uniform implant.

8 Claims, 13 Drawing Sheets

U.S. PATENT DOCUMENTS

| | | | |
|---|---|---|---|
| 5,289,010 | 2/1994 | Shohet | 250/492.21 |
| 5,296,272 | 3/1994 | Matossian et al. | 427/523 |
| 5,305,221 | 4/1994 | Atherton | 364/468 |
| 5,311,028 | 5/1994 | Glavish | 250/492.21 |
| 5,342,652 | 8/1994 | Foster et al. | 427/253 |
| 5,354,381 | 10/1994 | Sheng | 118/723 E |
| 5,374,564 * | 12/1994 | Bruel . | |
| 5,380,682 | 1/1995 | Edwards et al. | 437/225 |
| 5,427,638 | 6/1995 | Goetz et al. | 156/153 |
| 5,436,175 | 7/1995 | Nakato et al. | 437/24 |
| 5,498,290 | 3/1996 | Matossian et al. | 118/723 E |
| 5,525,159 | 6/1996 | Hama et al. | 118/723 |
| 5,554,249 | 9/1996 | Hasegawa | 156/345 |
| 5,554,853 | 9/1996 | Rose | 250/492.21 |
| 5,580,429 | 12/1996 | Chan et al. | 204/192.38 |
| 5,641,707 | 6/1997 | Moslehi | 438/513 |
| 5,661,043 | 8/1997 | Rissman et al. | 438/162 |
| 5,662,770 * | 9/1997 | Donohoe . | |
| 5,711,812 | 1/1998 | Chapek et al. | 118/723 E |
| 5,822,172 | 10/1998 | White | 361/234 |
| 5,854,123 | 12/1998 | Sato et al. | 438/507 |
| 5,856,674 | 1/1999 | Kellerman | 250/423 |
| 6,027,988 * | 2/2000 | Cheung et al. . | |
| 6,074,448 * | 6/2000 | Roderick et al. . | |

* cited by examiner

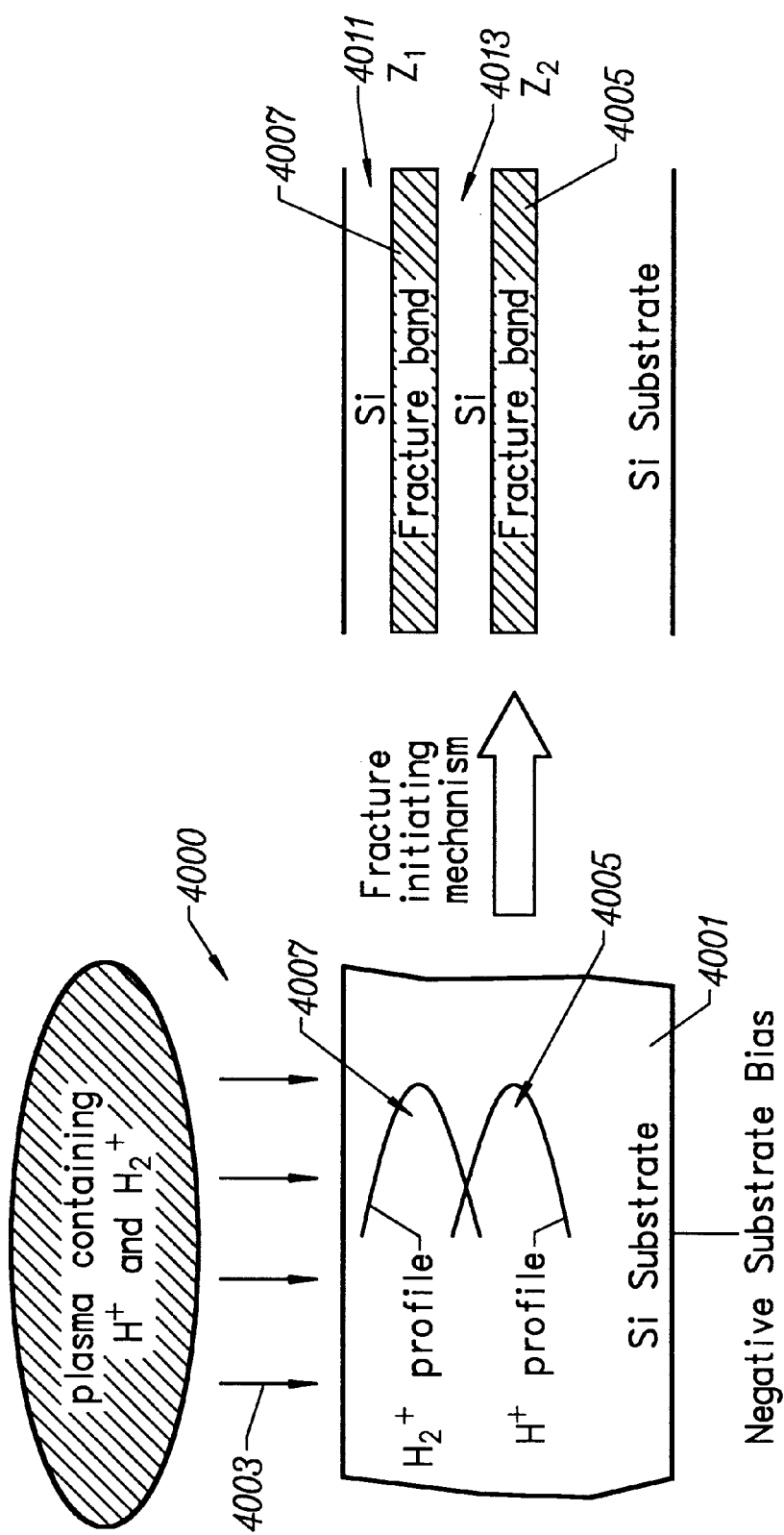

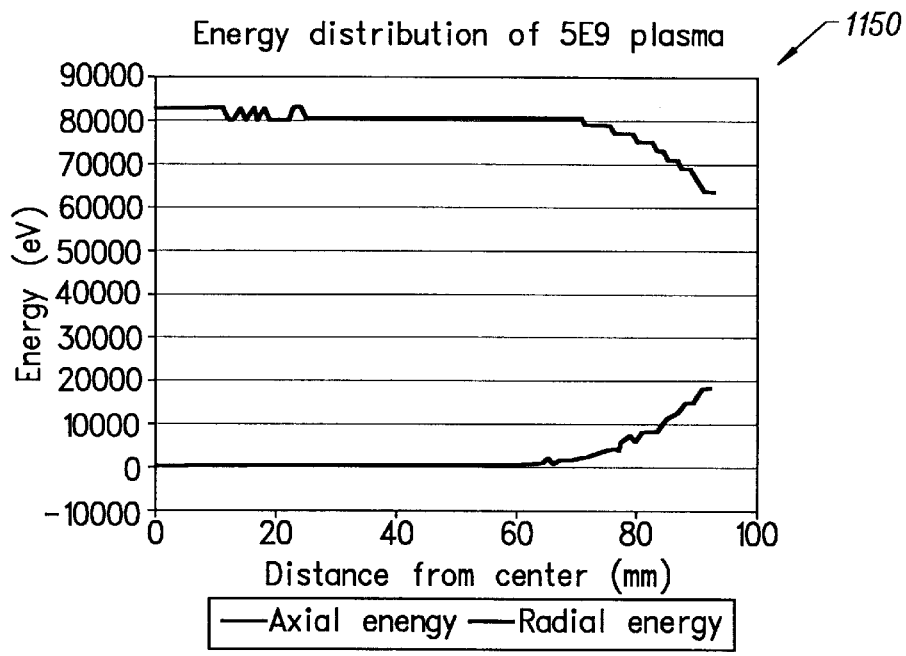
FIG. 10D
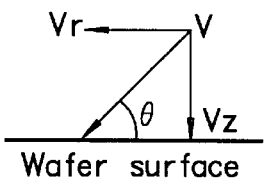
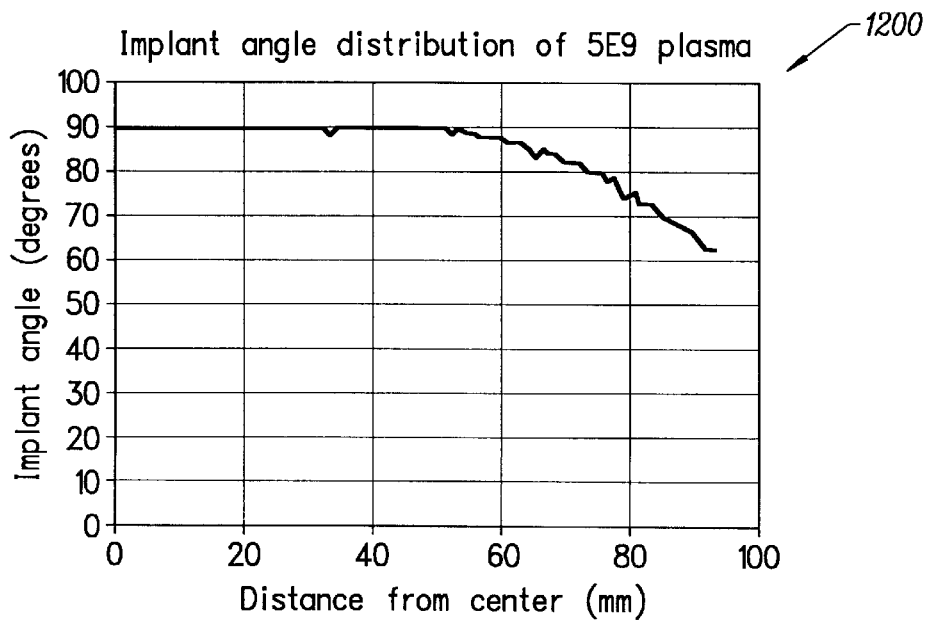
FIG. 10E

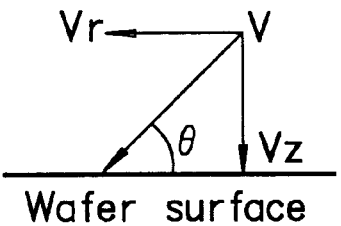
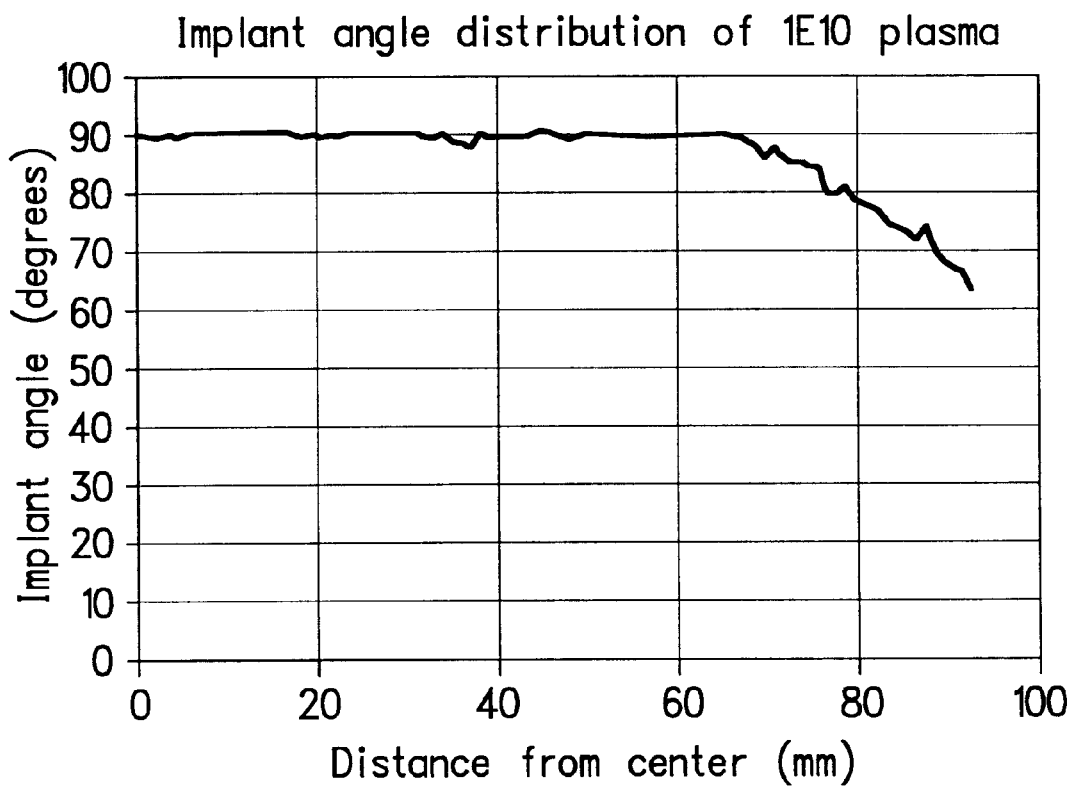
FIG. 10G

METHOD FOR NON MASS SELECTED ION IMPLANT PROFILE CONTROL

This application claims the benefit of U.S. Provisional Application No. 60/074,944, filed Feb. 17, 1998, the disclosure of which is incorporated by reference.

BACKGROUND OF THE INVENTION

The present invention relates to the manufacture of substrates. More particularly, the invention provides a technique including a method and device for introducing ions into a substrate for fabricating silicon-on-insulator wafers using a separating process in a cost effective and efficient manner.

Techniques have been proposed or used for the manufacture of silicon-on-insulator ("SOI") wafers. One of these techniques is called "separation by implantation of oxygen," commonly termed SIMOX. A detailed description of this process is described in Stanley Wolf Ph.D., SILICON PROCESSING FOR THE VLSI ERA (Volume 2), pages 66–79, which are hereby incorporated by reference. This technique generally uses conventional beam-line ion implanters for introducing the oxygen into the silicon wafer.

A limitation with the conventional SIMOX process is generally the cost of the resulting wafer. This cost often stems from the long time needed to implant a sufficient dose of oxygen into the silicon wafer. Since ion implanters commonly represent one of the largest capital cost items in a fabrication facility, it is often difficult to allocate the implanter for use in the conventional SIMOX process, which is often used for a variety of other integrated circuit processing operations. Additionally, many fabrication facilities (e.g., integrated circuit and wafer) simply cannot afford purchasing additional ion implantation equipment due to its excessive cost. Accordingly, silicon-on-insulator wafers made using the conventional SIMOX process are often costly and generally take a long time to fabricate.

Another technique for fabricating silicon-on-insulator wafer is commonly termed Smart Cut™. This technique uses conventional beam-line ion implantation equipment to introduce hydrogen to a selected depth into a substrate. The substrate is bonded to an insulating layer overlying a bulk substrate to form a multi-layered substrate structure. The multi-layered substrate is introduced into a furnace to increase the global temperature of the entire substrate, which blisters off a portion of substrate material from the substrate at the selected depth, thereby leaving a thin film of substrate material on the insulating material to form the silicon-on-insulator wafer. U.S. Pat. No. 5,374,564, which is in the name of Michel Bruel ("Bruel"), and assigned to Commissariat a l'Energie Atomique in France, describes this technique.

Unfortunately, the use of conventional beam line ion implantation equipment is quite expensive. In fact, the Smart Cut™ process generally requires large doses of hydrogen, which often takes a long time to implant. Additionally, the long time necessary to implant hydrogen by the implanter generally increases processing costs, which produces a higher cost wafer. Furthermore, the conventional beam line implanter often represents one of the highest equipment costs in a fabrication facility, which adds to the cost of producing the wafer. Numerous other limitations also exist with the use of the conventional beam line ion implantation equipment. Techniques have been proposed to use non-mass separated processes for implanting substrates. These techniques include, among others, plasma immersion ion implantation ("PIII"), ion shower, and the like. These techniques generally use a "chamber" process for introducing particles into substrate surfaces for the purposes of implantation. Unfortunately, these chamber processes often produce non-uniform implant profiles, which are undesirable for some applications such as those noted above.

From the above, it is seen that a technique for fabricating a substrate which is cost effective and efficient is often desirable.

SUMMARY OF THE INVENTION

According to the present invention, an improved technique for implanting substrates in the manufacture of substrates is provided. In particular, the present invention uses a plasma immersion ion implantation ("PIII") process for introducing ions into a silicon wafer for fabricating a silicon-on-insulator substrate. The invention also can be applied to almost any application for removing a film(s) of material from a substrate.

In a specific embodiment, the present invention provides a method for implanting a substrate using a plasma processing apparatus. The method includes providing a substrate (e.g., wafer, panel) on a face of a susceptor. The substrate has an exposed face, which has a substrate diameter that extends from a first edge of the substrate to a second edge of the substrate across a length of the substrate. The method also includes forming a plasma sheath around the face of the substrate. The plasma sheath has a dark space distance that extends in a normal manner from the exposed face to an edge of the plasma sheath. The dark space distance and the substrate diameter comprise a ratio between the dark space distance and the substrate diameter. The ratio is about one half and less, which provides a substantially uniform implant. The ratio is substantially constant within the entire substrate, which extends along the substrate diameter. In some embodiments, however, the ratio is substantially constant along all portions of the substrate except for edges of the substrate. The implant is performed by placing a voltage potential (e.g., 10 KeV, 20 KeV, 50 KeV, 80 KeV) between the plasma and the substrate, which accelerates the charged particles into the substrate to a selected depth.

Numerous benefits are achieved by way of the present invention over preexisting techniques. In particular, the present invention relies upon a PIII system which can easy introduce ions into a substrate in a relatively timely process. The PIII process is often significantly faster than conventional implanters, e.g., beam line. Additionally, the PIII process can be readily incorporated into conventional fabrication facilities in an efficient and cost effective manner. The present invention also provides selected process parameters that greatly enhance uniformity for PIII applications that require such uniformity. Depending upon the embodiment, one or more of these benefits can be achieved.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

FIGS. 8–9 are simplified cross-sectional view diagrams of an alternative process for fabricating a silicon-on-insulator; and FIGS. 10A–10H are diagrams of experimental data according to embodiments of the present invention.

DESCRIPTION OF A SPECIFIC EMBODIMENT

According to the present invention, an improved technique for implanting substrates in the manufacture of wafers is provided. As merely an example, the present invention can be used to manufacture silicon-on-silicon wafers, silicon-on-insulator wafers, and many others. In particular, the present invention uses a plasma immersion ion implantation process for introducing ions into a silicon wafer for fabricating silicon-on-insulator substrates and other multi-layered substrates.

Figure 1:
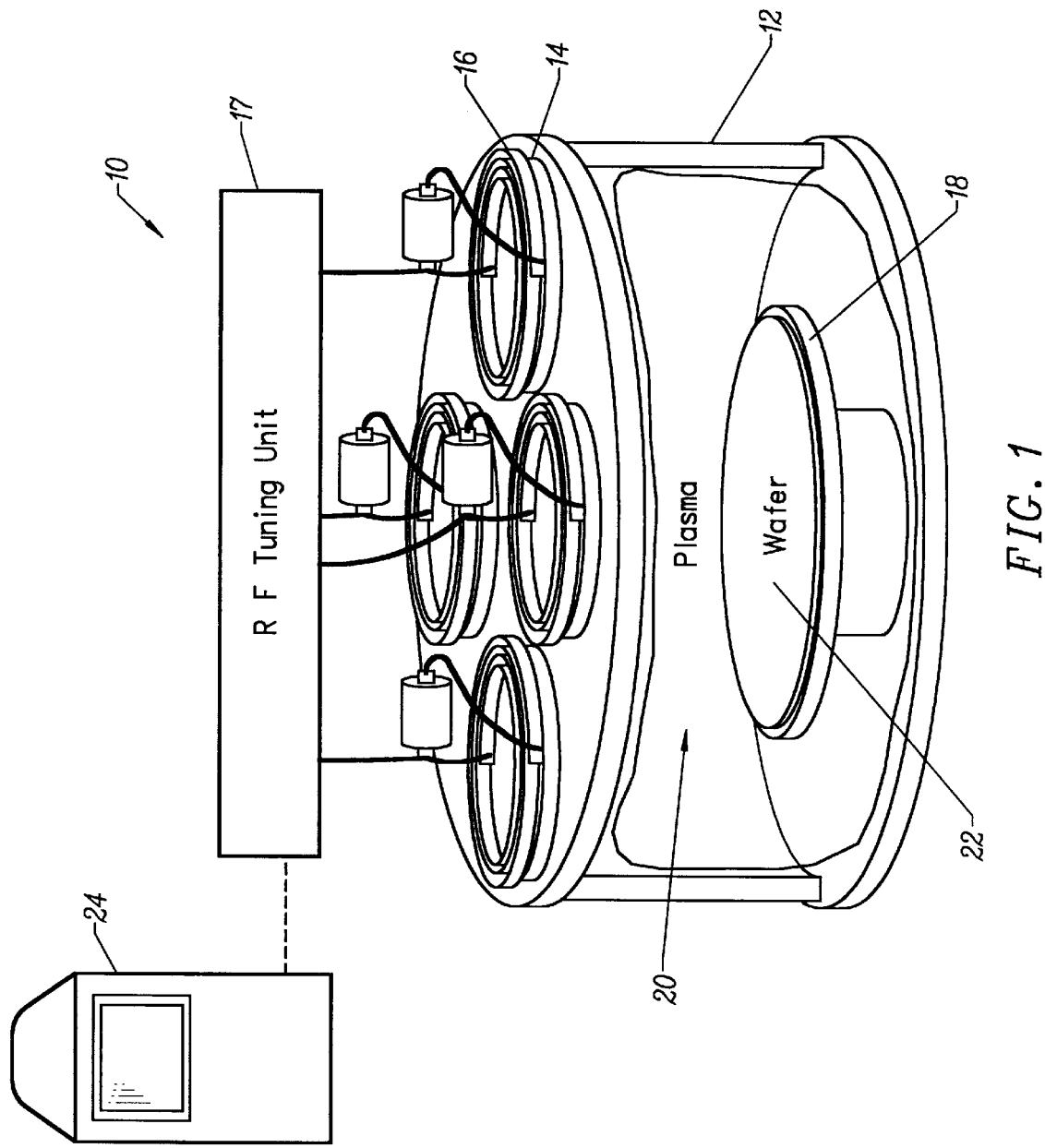
FIGS. 1–1B are simplified diagrams of a plasma immersion ion implantation system.

FIG. 1 is a simplified diagram of a plasma immersion ion implantation system 10 according to the present invention. This diagram is merely an illustration and should not limit the scope of the claims herein. One of ordinary skill in the art would recognize other variations, modifications, and alternatives. System 10 includes a variety of elements such as a chamber 12, and a plurality radio frequency sources 16. Each source 16 is mounted on a quartz plate 14. Each source 16 is coupled to an rf tuning unit 17 and is capable of providing a discharge 20 in the chamber. In other embodiments, the chamber can also have a single rf source. The chamber can be flat or domed, depending upon the embodiment. Susceptor 18 has a wafer 22 thereon, which can be heated or cooled.

Figure 1A:
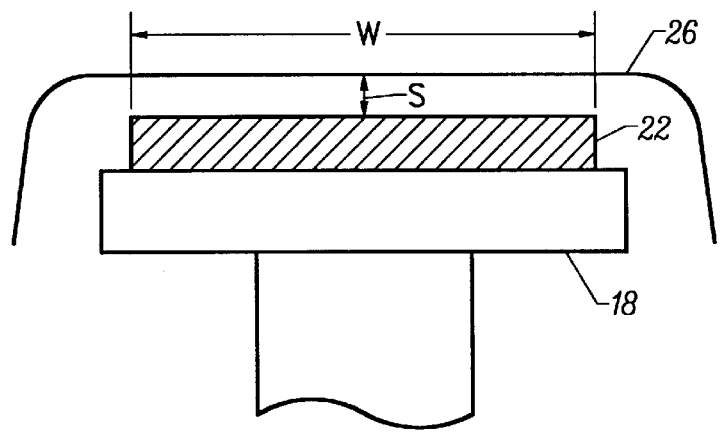

The present chamber also has a plasma therein, as shown in FIG. 1A. Like reference numbers are used in this FIG. as the previous FIG. for easy referencing. This FIG., however, should not generally limit the previous FIG. The plasma comprises a plasma sheath, which forms over a surface of the substrate. The plasma sheath is selectively adjusted relative to the substrate to provide a uniform implantation process. In a specific embodiment, the plasma sheath can be characterized by a dark space distance, which extends from the surface of the substrate (in a normal manner) to an edge of the plasma sheath. The dark space distance is represented by the letter S in the FIG. The dark space distance is often selected relative to the length or diameter of the substrate to achieve a uniform implant. The dark space distance can be measured via optical means or Langmuir probe. C.Chan, Z. Jin and C. Whitaker, "Characterization of Low Frequency RF Discharges by Time-Averaged Langmuir Probe and Spectroscopic Measurements", J. Appl. Phys. 62, pp 1633–1638 (1987); Z. Jin, C. Whitaker and C, Chan, "Plasma Emission Spectroscopy with an Optical Pibre Probe", Rev. Sci. Instrum. 59, pp 427–429 (1988); S. Qin, C. Chan, N. McGruer, J. Browning and K. Warner, "the Response of a Microwave Multipolar Bucket Plasma to a High Voltage Pulse", IEEE Trans. Plasma Science, 19, pp 1272–1278 (1991) describe techniques for measuring dark space distance. In a specific embodiment, the dark space distance and the substrate length include a ratio (i.e., dark space distance:substrate length) that is selected to provide a uniform implant. The uniform implant has a depth uniformity variation of about three percent or two percent or one percent or less. The ratio is achieved by adjusting parameters such as plasma density, rf coil orientation, and other factors.

In a specific embodiment, the present chamber can be used to form a plasma bearing hydrogen particles, e.g., hydrogen ions. In a specific embodiment using a hydrogen bearing particle, the susceptor can maintain a wafer temperature of about 205 or 200 degrees Celsius and less, but is not limited to such value. The chamber is generally maintained under a vacuum, which is about 1 millitorr and less or 0.5 millitorr and less or 0.2 millitorr and less, which can prevent a portion of neutrals from forming in the chamber in embodiments using a hydrogen bearing particle. The chamber also has a voltage source, which can form a large voltage potential between a plasma formed in the chamber and the susceptor. The voltage potential can be 10 keV and greater, 15 keV and greater, 20 keV and greater, or 50 keV and greater, but is not limited to these values. The hydrogen ion density can range from about $10^{10}$ ions/cm$^3$ and greater or about $10^{11}$ ions/cm$^3$ and greater, depending upon the application. The ratio between the dark space distance and substrate length is about one half and less or one third and less or one quarter and less or one tenth and less, depending upon the embodiment, to achieve a uniform implant. The susceptor can handle wafers that are about 200 millimeters and greater or 300 millimeters and greater. Of course, smaller diameter wafers can also be used.

In a specific embodiment, the plasma sheath is also maintained in a predetermined manner. As merely an example, the present plasma sheath can be in a high density protonic mode implant, which has an extremely high density. U.S. application Ser. No. 09/203,025, which is incorporated by reference herein, describes such a protonic mode plasma. The sheath has a predetermined thickness, which is "thin" where collisional effects from neutrals in the plasma are minimized or substantially reduced. The collisional effects can be reduced by operating the plasma in a reduced pressure (e.g., 0.5 millitorr or less) such as those noted above for hydrogen bearing particles. Of course, the predetermined thickness of the sheath will depend upon the particular application.

Figure 1B:
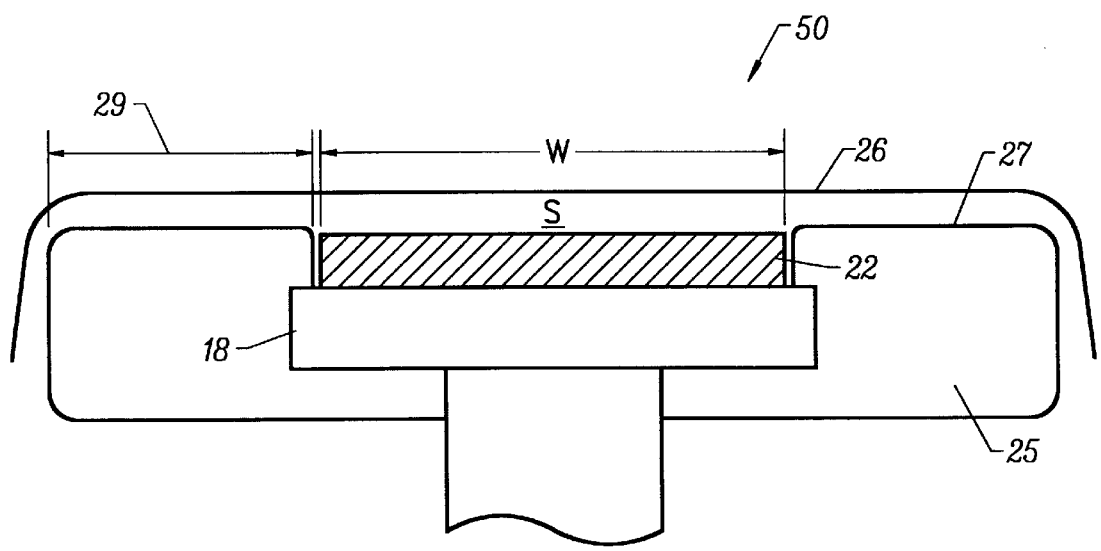

FIG. 1B is a simplified diagram 50 of a susceptor in a chamber according to an alternative embodiment. This diagram 50 is merely an illustration, which should not limit the scope of the claims herein. Like reference numerals are used in this FIG., as the previous FIG. for easy referencing. As shown, the substrate 22, which rests on the susceptor 18, is shown. The susceptor is in a chamber, such as the one described above, as well as others. A guard ring 25 is placed on the susceptor. The guard ring surrounds the susceptor such that an upper surface 27, which is about the same level as the substrate face, of the guard ring occupies a region around a periphery of the substrate. In some embodiments, the guard ring upper surface is substantially parallel to the upper surface of the face of the substrate. The region surrounding the periphery of the substrate can have a constant width. The guard ring extends outside of the substrate. In some embodiments, the region extending outside of the susceptor has a length 29 that is at least about one half of the substrate diameter. Alternatively, the region extending outside the susceptor has a length that is at least about one quarter of the substrate diameter. The guard ring can be made of suitable materials such as silicon, metal, silicon coated materials, quartz, etc.

The guard ring has one or more benefits. For example, the guard ring adjusts the shape of the plasma sheath 26. In some embodiments, the guard ring provides a smaller ratio for the distance between the dark space distance S and the width of the substrate W. The guard ring can also flatten electric field lines near edges of the substrate, which reduces any "fringing" effects. The guard ring also can be easily installed into conventional PIII systems. Additionally, the guard ring can also be removed for maintenance and the like. Accordingly, the guard ring can provide a more uniform implant profile, which is desirable. Depending upon the application, one or more of these benefits may be present.

A controller 24 oversees the functions of system 10. Controller 24 can have a variety of features such as a monitor, a central processing unit, and sufficient memory, including dynamic and static memory devices. Controller 24 also has a graphical user interface ("GUI"), which has menus for a variety of process recipes. The recipes are in the form of a computer program or the like. The controller can also be coupled to a local or wide area network, including the Internet. Further details of the PIII system can be found in Qian et al, "A Plasma Immersion Ion Implantation Reactor For ULSI Fabrication," Nuclear Instrument and Methods, Vol. B55, pp. 884–887 (1991), which is hereby incorporated by reference for all purposes. The controller with memory can include software programs (i.e., computer codes) that carryout the functionality or methods described herein, as well as others.

Although the above has been described generally in terms of a hydrogen bearing plasma, other types of plasmas can be used. For example, the present invention can also be used for oxygen bearing plasmas or a mixture of hydrogen and helium bearing plasmas, as well as other particle species. One of ordinary skill in the art would recognize many other variations, modifications, and alternatives. Accordingly, the present description should not unduly limit the scope of the claims herein.

A process for fabricating a silicon-on-insulator substrate according to the present invention may be briefly outlined as follows:

(1) Provide a donor silicon wafer (which may be coated with a dielectric material);

(2) Form a plasma sheath such that a ratio of the dark space distance and the substrate width is reduced to a predetermined level.

(3) Introduce particles in a uniform manner into the silicon wafer to a selected depth to define a thickness of silicon film;

(4) Provide a receptor (i.e., target) substrate material (which may be coated with a dielectric material);

(5) Bond the donor silicon wafer to the receptor substrate material by joining the implanted face to the receptor substrate material;

(6) Increase global stress (or energy) of implanted region at selected depth to free the thickness of silicon film from the silicon wafer;

(7) Complete bonding of silicon wafer to the receptor substrate; and (8) Polish a surface of the thickness of silicon film, if desirable.

The above sequence of steps provides a process for separating a film of material from a substrate using a novel PIII implantation technique to form, for example, a silicon-on-insulator wafer. The steps can use a PIII apparatus such as the one described above, but can also be others. This sequence of steps is merely an example and should not limit the scope of the claims defined herein. Further details with regard to the above sequence of steps are described below in references to the FIGS.

FIGS. 2–7 are simplified cross-sectional view diagrams of substrates undergoing a fabrication process for a silicon-on-insulator wafer according to the present invention. These diagrams are merely illustrations and should not limit the scope of the claims herein. One of ordinary skill in the art would recognize other variations, alternatives, and modifications.

Figure 2:
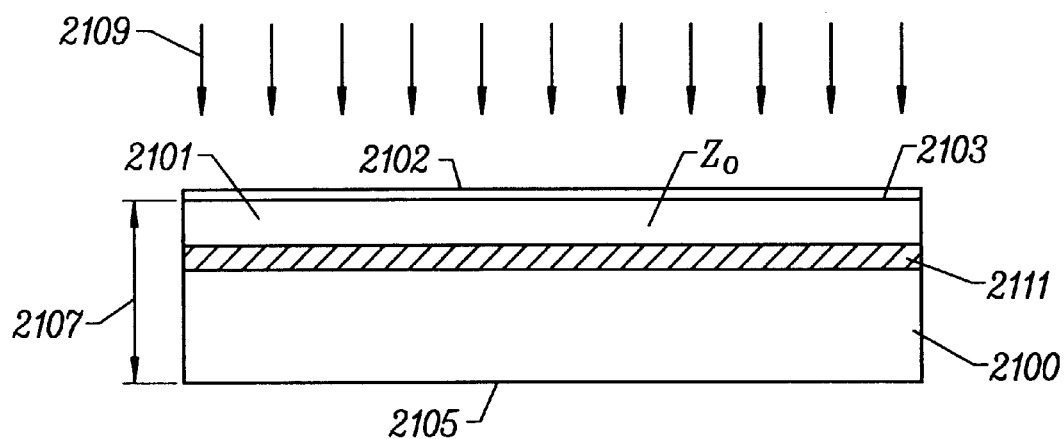
FIGS. 2–7 are simplified cross-sectional view diagrams of a process for fabricating a silicon-on-insulator wafer according to the present invention.

The process begins by providing a semiconductor substrate similar to the silicon wafer 2100, as shown by FIG. 2. Substrate or donor includes a material region 2101 to be removed, which is a thin relatively uniform film derived from the substrate material. The silicon wafer includes a top surface 2103, a bottom surface 2105, and a thickness 2107. Material region also includes a thickness ($z_0$), within the thickness 2107 of the silicon wafer. Optionally, a dielectric layer 2102 (e.g., silicon nitride, silicon oxide, silicon oxynitride) overlies the top surface of the substrate. The present process provides a novel technique for implanting particles and removing the material region 2101 using the following sequence of steps for the fabrication of a silicon-on-insulator wafer.

The present process forms a plasma in a selected manner to achieve a substantially uniform implant across a portion of the wafer. In a specific embodiment for hydrogen implanting, the present method includes selected processing parameters. These parameters form a plasma including hydrogen particles. Here, the susceptor can maintain a wafer temperature of about 205 or 200 Degrees Celsius and less, but is not limited to such value. The chamber such as the one described above is generally maintained under a vacuum, which is about 1 millitorr and less or 0.5 millitorr and less or 0.2 millitorr and less, which can prevent a portion of neutrals from forming in the chamber in embodiments using a hydrogen bearing particle. A large voltage source, which can form a large voltage potential between a plasma formed in the chamber and the susceptor, is also available. The voltage potential can be 10 keV and greater, 15 keV and greater, 20 keV and greater, 50 keV and greater, or 80 keV and greater, but is not limited to these values. The hydrogen ion density can range from about $10^{10}$ ions/cm$^3$ and greater or about $10^{11}$ ions/cm$^3$ and greater, depending upon the application. The ratio between the dark space distance and substrate length is about one half and less or one third and less or one quarter and less or one tenth and less, depending upon the embodiment, to achieve a uniform implant. The ratio is substantially constant within the entire substrate, which extends along the substrate diameter. In some embodiments, however, the ratio is substantially constant along all portions of the substrate except for edges of the substrate. The susceptor can handle wafers that are about 200 millimeters and greater or 300 millimeters and greater. Of course, smaller diameter wafers can also be used.

In a specific embodiment, the plasma sheath is also maintained in a predetermined manner. As merely an example, the present plasma sheath can be in a high density protonic mode implant, which has an extremely high density. U.S. application Ser. No. 09/203,025, which is incorporated by reference herein, describes such a protonic mode plasma. The sheath has a predetermined thickness, which is "thin" where collisional effects from neutrals in the plasma are minimized or substantially reduced. The collisional effects can be reduced by operating the plasma in a reduced pressure (e.g., 0.5 millitorr or less) such as those noted above for hydrogen bearing particles. Of course, the predetermined thickness of the sheath will depend upon the particular application.

Selected energetic particles 2109 implant through the top surface of the silicon wafer to a selected depth, which defines the thickness of the material region, termed the thin film of material. As shown, the particles have a desired concentration 2111 at the selected depth ($z_0$). A variety of techniques can be used to implant the energetic particles into the silicon wafer. According to the present invention, however, a PIII technique will be used to introduce the particles into the silicon wafer. The PIII technique can be provided by the aforementioned apparatus, as well as others. In most embodiments, the particles placed in the substrate alter mechanical and/or chemical properties of the bulk substrate. A dose rate can range from about $10^{15}$ ions/$cm^2$-second and higher, and is not influenced by increasing substrate area, since the entire substrate is implanted at the same time.

Depending upon the application, smaller mass particles are generally selected to reduce a possibility of damage to the material region. That is, smaller mass particles easily travel through the substrate material to the selected depth without substantially damaging the material region that the particles traversed through. For example, the smaller mass particles (or energetic particles) can be almost any charged (e.g., positive or negative) and/or neutral atoms or molecules, or electrons, or the like. In a specific embodiment, the particles can be neutral and/or charged particles including ions of hydrogen and its isotopes, rare gas ions such as helium and its isotopes, and neon. The particles can also be derived from compounds such as gases, e.g., hydrogen gas, water vapor, methane, and other hydrogen compounds, and other light atomic mass particles. Alternatively, the particles can be any combination of the above particles, and/or ions and/or molecular species and/or atomic species.

In a specific embodiment, the particles are introduced at a selected temperature to prevent out diffusion of the particles (e.g., gas) from the substrate. In particular, the temperature is maintained below the diffusion temperature, which causes gas produced by the particles to escape from the substrate. So, the substrate temperature is controlled throughout the PIII operation and is maintained below the critical temperature where gas produced in the substrate by the PIII process diffuses rapidly and escapes from the substrate. Hydrogen implantation of silicon, for example, has a critical temperature of about 500° C. Accordingly, the PIII process becomes substantially ineffective due to the absence of bubble formation at temperatures above 500° C. in some embodiments. In silicon, for example, PIII is maintained between 20° and 450° C. for PIII of hydrogen to maintain bubbles at the selected depth.

Figure 3:
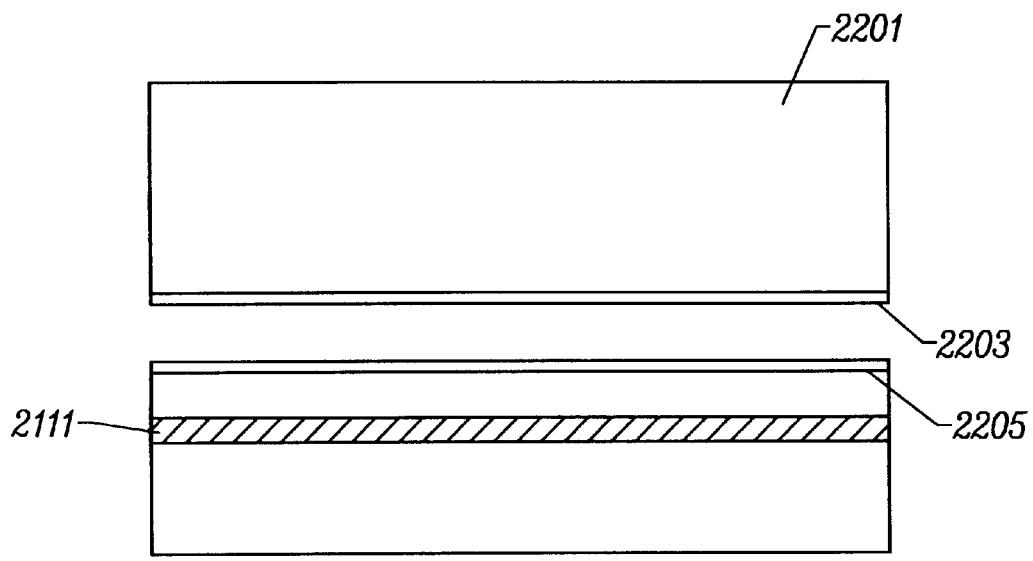

The process uses a step of joining the implanted silicon wafer to a workpiece or receptor wafer 2201, as illustrated in FIG. 3. The workpiece may also be a variety of other types of substrates such as those made of a dielectric material (e.g., quartz, glass, silicon nitride, silicon dioxide), a conductive material (silicon, polysilicon, group III/V materials, metal), and plastics (e.g., polyimide-based materials). In the present example, however, the workpiece is a silicon wafer.

In a specific embodiment, the silicon wafers are joined or fused together using a low temperature thermal step. The low temperature thermal process generally ensures that the implanted particles do not place excessive stress on the material region, which can produce an uncontrolled cleave action. In one aspect, the low temperature bonding process occurs by a self-bonding process. In particular, one wafer is stripped to remove oxidation therefrom (or one wafer is not oxidized). A cleaning solution treats the surface of the wafer to form O—H bonds on the wafer surface. An example of a solution used to clean the wafer is a mixture of $H_2O_2$—$H_2SO_4$. A dryer dries the wafer surfaces to remove any residual liquids or particles from the wafer surfaces. Self-bonding occurs by placing a face of the cleaned wafer against the face of an oxidized wafer.

Alternatively, a self-bonding process occurs by activating one of the wafer surfaces to be bonded by plasma cleaning. In particular, plasma cleaning activates the wafer surface using a plasma derived from gases such as argon, ammonia, neon, water vapor, and oxygen. The activated wafer surface 2203 is placed against a face of the other wafer, which has a coat of oxidation 2205 thereon. The wafers are in a sandwiched structure having exposed wafer faces. A selected amount of pressure is placed on each exposed face of the wafers to self-bond one wafer to the other.

Alternatively, an adhesive disposed on the wafer surfaces is used to bond one wafer onto the other. The adhesive includes an epoxy, polyimide-type materials, and the like. Spin-on-glass layers can be used to bond one wafer surface onto the face of another. These spin-on-glass ("SOG") materials include, among others, siloxanes or silicates, which are often mixed with alcohol-based solvents or the like. SOG can be a desirable material because of the low temperatures (e.g., 150 to 250° C.) often needed to cure the SOG after it is applied to surfaces of the wafers.

Alternatively, a variety of other low temperature techniques can be used to join the donor wafer to the receptor wafer. For instance, an electro-static bonding technique can be used to join the two wafers together. In particular, one or both wafer surface(s) is charged to attract to the other wafer surface. Additionally, the donor wafer can be fused to the target wafer using a variety of commonly known techniques. Of course, the technique used depends upon the application.

Figure 4:
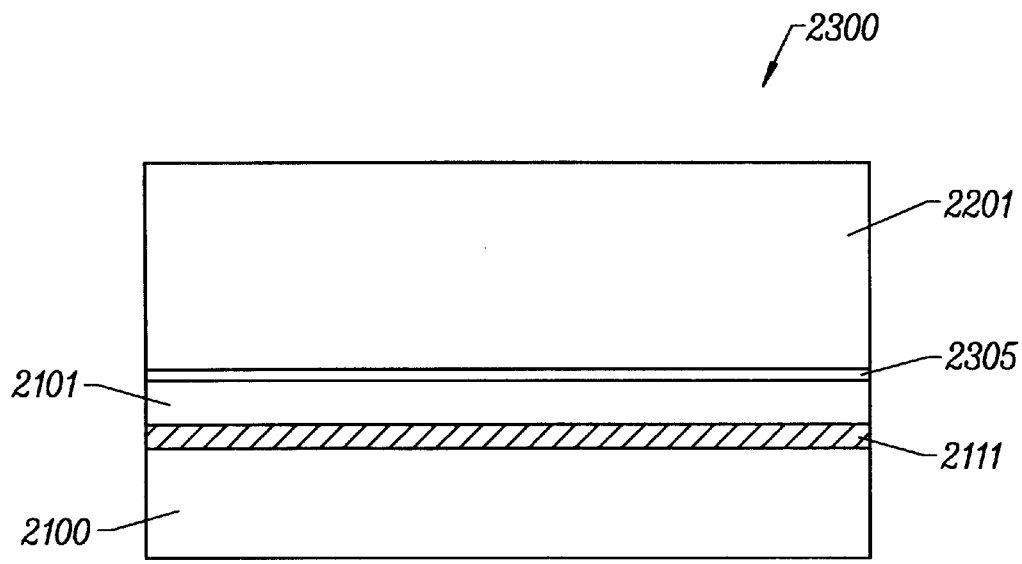

After bonding the wafers into a sandwiched structure 2300, as shown in FIG. 4, the method includes a film separation process or cut process to remove the substrate material to provide a thin film of substrate material 2101 overlying an insulator 2305 wafer 2201. To separate the film of material from the substrate, an energy or stress of the substrate material is increased toward an energy level necessary to initiate the cleaving action to free the film of material. In particular, a global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, a gas jet, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global energy source increases a level of energy or stress in the material region to free the film of material from the substrate.

As merely an example, separation occurs by global heat treatment of the bonded structure. In particular, the bonded structure is placed in a thermal treatment furnace or the like. The furnace applies heat to the structure to a temperature above the temperature that PIII takes place and adequate enough to create a crystalline rearrangement effect in the wafer. Additionally, the thermal treatment creates a pressure effect in microbubbles, which creates separation between the thin film of material from the bonded substrate. A process of removing the thin film of material from the bonded substrate is often termed conventional Smart Cut™, which blisters off a film of material from the substrate. This process is commonly time consuming and expensive by way of conventional beam line implantation techniques, but becomes highly cost effective by way of the novel PIII techniques.

Figure 5:
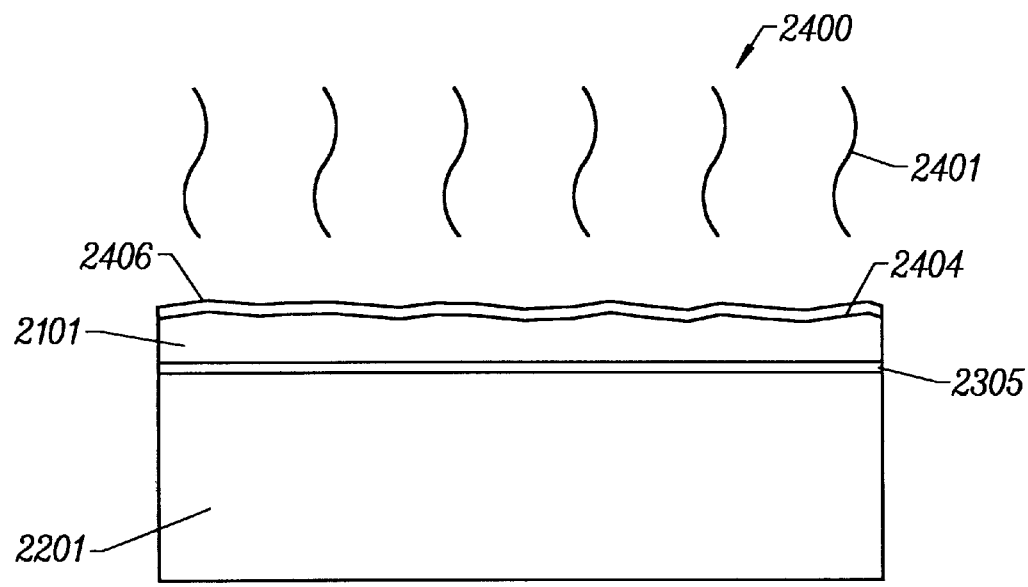

After removing the film of material, a final bonding step occurs between the target wafer and thin film of material region according to some embodiments, as illustrated at 2400 in FIG. 5. In one embodiment, one silicon wafer has an overlying layer of silicon dioxide, which is thermally grown overlying the face before cleaning the thin film of material. The silicon dioxide can also be formed using a variety of other techniques, e.g., chemical vapor deposition. The silicon dioxide between the wafer surfaces fuses together thermally in this process.

In some embodiments, the oxidized silicon surface from either the receptor wafer or the thin film of material region (from the donor wafer) are further pressed together and are subjected to an oxidizing ambient 2401. The oxidizing ambient can be in a diffusion furnace for steam oxidation, hydrogen oxidation, or the like. A combination of the pressure and the oxidizing ambient fuses the two silicon wafers together at the oxide surface or interface 2305. These embodiments often require high temperatures (e.g., 700° C.).

Alternatively, the two silicon surfaces are further pressed together and subjected to an applied voltage between the two wafers. The applied voltage raises temperature of the wafers to induce a bonding between the wafers. This technique limits the amount of crystal defects introduced into the silicon wafers during the bonding process, since substantially no mechanical force is needed to initiate the bonding action between the wafers. Of course, the technique used depends upon the application.

After bonding the wafers, silicon-on-insulator has a target substrate with an overlying film of silicon material and a sandwiched oxide layer between the target substrate and the silicon film, as also illustrated in FIG. 5. The detached surface 2400 of the film of silicon material is often rough 2404 and needs finishing. Finishing occurs using a combination of grinding and/or polishing techniques. In some embodiments, the detached surface undergoes a step of grinding using, for examples, techniques such as rotating an abrasive material overlying the detached surface to remove any imperfections or surface roughness therefrom. A machine such as a "back grinder" made by a company called Disco may provide this technique.

Figure 6:
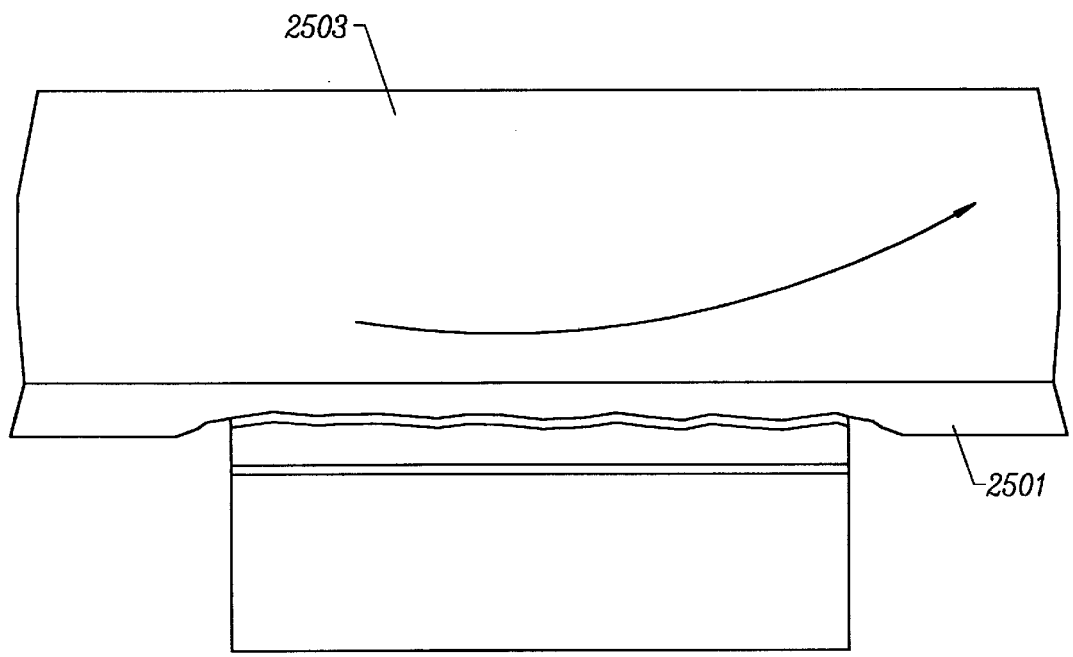

Alternatively, chemical mechanical polishing or planarization ("CMP") techniques finish the detached surface of the film, as illustrated by FIG. 6. In CMP, a slurry mixture is applied directly to a polishing surface 2501 which is attached to a rotating platen 2503. This slurry mixture can be transferred to the polishing surface by way of an orifice, which is coupled to a slurry source. The slurry is often a solution containing an abrasive and an oxidizer, e.g., $H_2O_2$, $KIO_3$, ferric nitrate. The abrasive is often a borosilicate glass, titanium dioxide, titanium nitride, aluminum oxide, aluminum trioxide, iron nitrate, cerium oxide, silicon dioxide (colloidal silica), silicon nitride, silicon carbide, graphite, diamond, and any mixtures thereof. This abrasive is mixed in a solution of deionized water and oxidizer or the like. Preferably, the solution is acidic.

Figure 7:
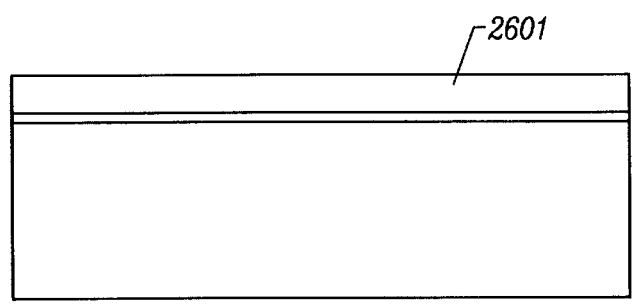

This acid solution generally interacts with the silicon material from the wafer during the polishing process. The polishing process preferably uses a polyurethane polishing pad. An example of this polishing pad is one made by Rodel and sold under the tradename of IC-1000. The polishing pad is rotated at a selected speed. A carrier head which picks up the target wafer having the film applies a selected amount of pressure on the backside of the target wafer such that a selected force is applied to the film. The polishing process removes a selected amount of film material, which provides a relatively smooth film surface 2601 for subsequent processing, as illustrated by FIG. 7.

In certain embodiments, a thin film of oxide overlies the film of material overlying the receptor wafer. The oxide layer forms during the thermal annealing step, which is described above for permanently bonding the film of material to the receptor wafer. In these embodiments, the finishing process is selectively adjusted to first remove oxide and the film is subsequently polished to complete the process. Of course, the sequence of steps depends upon the particular application.

FIGS. 8–9 are simplified cross-sectional view diagrams of an alternative process for fabricating a silicon-on-insulator wafer according to the present invention. These diagrams are merely illustrations and should not limit the scope of the claims herein. One of ordinary skill in the art would recognize other variations, alternatives, and modifications. As shown, these diagrams illustrate a double cleaving process according to the present invention.

The process 4000 begins by providing a semiconductor substrate similar to the substrate 4001, as shown by FIG. 8. Substrate 4001 can be a multilayered wafer as well as a bulk wafer, e.g., silicon. Substrate 4001 is implanted 4003 using a selected mixture of particles to create two fracture zones 4005 and 4007. The two fracture zones can be made by way of two implanting steps or a single PIII step, which is properly tuned. For example, a hydrogen plasma can be tuned by achieving approximately a 1:2 ratio of $H_2+:H+$ ion concentrations for implanting into silicon. Implantation dose can range from about $10^{15}$ ions/cm$^2$ to about $10^{18}$ ions/cm$^2$, and others. Temperature can range from about −200° C. to about 500° C., and others.

In a specific embodiment, the present process forms a plasma in a selected manner to achieve a substantially uniform implant across a portion of the wafer. In a specific embodiment for hydrogen implanting, the present method includes selected processing parameters such as the ones noted above, which can also be applied to multiple species implants with some variations. Here, the susceptor can maintain a wafer temperature to prevent outdiffusion of the implanted species. The chamber such as the one described above is generally maintained under a vacuum at low predetermined pressure, which can prevent a portion of neutrals from forming in the chamber. A large voltage source, which can form a large voltage potential between a plasma formed in the chamber and the susceptor, is also available. The voltage potential can be 10 keV and greater, 15 keV and greater, 20 keV and greater, 50 keV and greater, or 80 keV and greater, but is not limited to these values. The ion density can range from about $10^{10}$ ions/cm$^3$ and greater or about $10^{11}$ ions/cm$^3$ and greater, depending upon the application. The ratio between the dark space distance and substrate length is about one half and less or one third and less or one quarter and less or one tenth and less, depending upon the embodiment, to achieve a uniform implant. The ratio is substantially constant within the entire substrate, which extends along the substrate diameter. In some embodiments, however, the ratio is substantially constant along all portions of the substrate except for edges of the substrate. The susceptor can handle wafers that are about 200 millimeters and greater or 300 millimeters and greater. Of course, smaller diameter wafers can also be used.

After implantation, substrate or donor includes a first material region 4011 to be removed, and a second material region 4013 to be removed, which are each a thin relatively uniform film derived from the substrate material, as shown in FIG. 9. The first material region also includes a thickness ($z_1$) and the second material region includes a thickness ($z_2$), within the thickness of the silicon wafer. Optionally, a dielectric layer (e.g., silicon nitride, silicon oxide, silicon oxynitride) overlies the top surface of the substrate. The present process provides a novel technique for removing the two material regions.

The implanted substrate is then subjected to energy to detach the material regions from the bulk substrate. A variety of techniques can be used to detach the material regions from the bulk substrate. In particular, a global energy state of the substrate can be raised or lowered using a variety of sources such as chemical, mechanical, thermal (sink or source), or electrical, alone or in combination. The chemical source can include particles, fluids, gases, or liquids. These sources can also include chemical reaction to increase stress in the material region. The chemical source is introduced as flood, time-varying, spatially varying, or continuous. In other embodiments, a mechanical source is derived from rotational, translational, compressional, expansional, or ultrasonic energies. The mechanical source can be introduced as flood, time-varying, spatially varying, or continuous. In further embodiments, the electrical source is selected from an applied voltage or an applied electromagnetic field, which is introduced as flood, time-varying, spatially varying, or continuous. In still further embodiments, the thermal source or sink is selected from radiation, convection, or conduction. This thermal source can be selected from, among others, a photon beam, a fluid jet, a liquid jet, a gas jet, an electro/magnetic field, a gas jet, an electron beam, a thermoelectric heating, and a furnace. The thermal sink can be selected from a fluid jet, a liquid jet, a gas jet, a cryogenic fluid, a super-cooled liquid, a thermoelectric cooling means, an electro/magnetic field, and others. Similar to the previous embodiments, the thermal source is applied as flood, time-varying, spatially varying, or continuous. Still further, any of the above embodiments can be combined or even separated, depending upon the application. Of course, the type of source used depends upon the application. As noted, the global source increases a level of energy or stress in the material region to free the films of material from the substrate.

As merely an example, separation occurs by global heat treatment of the bonded structure. In particular, the bonded structure is placed in a thermal treatment furnace or the like. The furnace applies heat to the wafer to a temperature above the temperature that PIII takes place and adequate enough to create a crystalline rearrangement effect in the wafer. Additionally, the thermal treatment creates a pressure effect in the microbubbles, which creates separation between the thin film of material from the bonded substrate. A process of removing the films of material from the bonded substrate is often termed conventional Smart Cut™, which blisters off a film of material from a substrate. This process is commonly time consuming and expensive by way of conventional beam line implantation techniques, but becomes highly cost effective by way of the novel PIII techniques. The present invention can also be applied to ELTRAN™ by Canon which is described in U.S. Pat. No. 5,854,123, in the name of Sato et al., which is incorporated by reference.

Experiments:

To prove the principle and operation of the present invention, experiments were performed. These experiments included a combination of actual runs and simulations. We base these experiments using techniques described herein. Before discussing details of our experiments, it may assist the reader to understand some of the underlying theories, which we base our experiments. These theories are described below.

We believe that all implanted ions may experience a similar potential drop during implantation using a PIII apparatus such as the one described above but can also be others. The angle of incident, however, depends on ion trajectories given by the following relationship (where the vector terms are indicated in bold):

$$dv/dt = (qE/m) - 1$$

where v is a velocity vector;

t is time;

m is mass; and

E is an electric field vector.

As shown, the above relationship shows that the velocity vector depends upon the electric field vector. Solving the above relationship yields:

$$v(\text{normal}) = q/m \ E(\text{normal})(t)dt; \text{ and}$$

$$v(\text{parallel}) = q/m \ E(\text{parallel})(t)dt$$

where the term (normal) means normal to the substrate; and the term (parallel) means parallel to the substrate Based upon the above relationships, we found that the shape of the sheath can control the angle of the implant. The present experiments were performed to understand how to control the shape of the sheath to influence the implant profile in a desirable manner. In most layer transfer application using the above process, the implant uniformity variation should be at least three percent and less or preferably one percent and less. Additionally, the present layer transfer process forms relatively thin layers, which cannot be altered in a significant manner using conventional polishing processes such as CMP, touch polishing, and the like. Accordingly, it is relatively important to form a relatively uniform layer to prevent substantial polishing processes, which can remove large uneven portions of the film, which will cause damage to the resulting substrate structure.

Conventional implantation using PIII occurs in the following manner. In an example using a 50 KeV implant of hydrogen bearing particles, the implant depth should be about 3056 Angstroms. Total energy ("E") of the implant is 50 KeV, but has at least two general components. Here, total energy E includes a parallel component ("E(parallel)") and a vertical component ("E(normal)"), where E(normal) is 40 KeV and E(parallel) is 30 KeV, i.e., total energy E is equal to the square root of $E(\text{normal})^2 + E(\text{parallel})^2$. So, the total energy actually has an implant range of 2571 Angstroms, i.e., E(normal) is 40 KeV. Let us assume a sheath profile using a conventional PIII apparatus. The conventional PIII apparatus produces an implant profile that has a sixteen percent edge to center non-uniformity. We believe that such non-uniformity is caused since ions near the center of the substrate experience the full 50 KeV, while ions near the edge of the wafer are subject to edge effects that reduce the effective voltage to about 40 KeV. Accordingly, the ions at the edge of the substrate implant shallower than the ions at the center of the substrate, even though the total energy is still 50 KeV.

We understand that the implant profile is highly dependent upon the shape of the plasma sheath. The shape of the sheath is generally a function of the substrate size (e.g., 200 mm, 300 mm) and the distance of the dark space region. Preferably, the dark space distance is small compared to the substrate size. A ratio that defines the dark space distance to the substrate size is reduced to provide a substantially uniform implant, which has a variation of less than about three percent, depending upon the application.

Figure 10A:
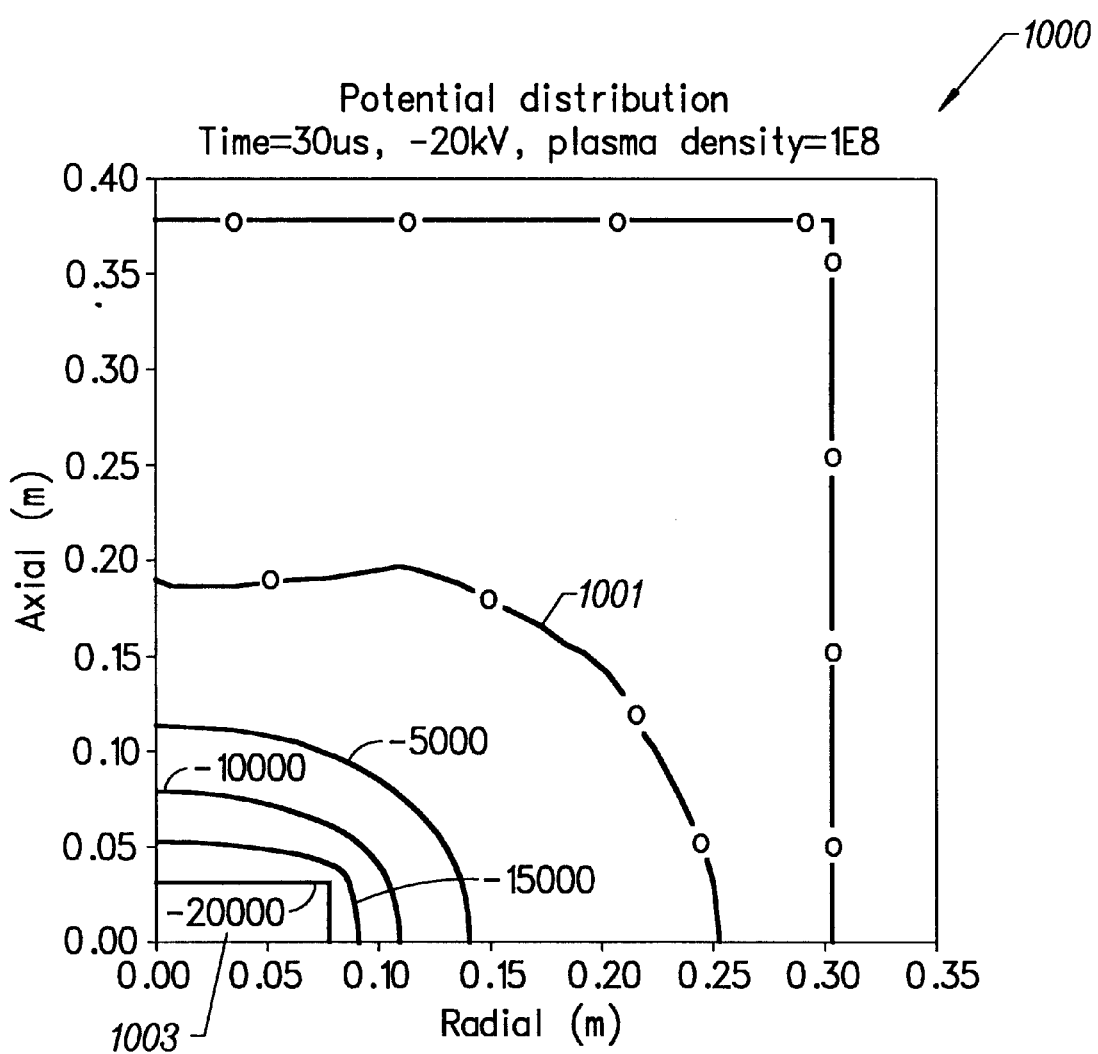
Figure 10B:
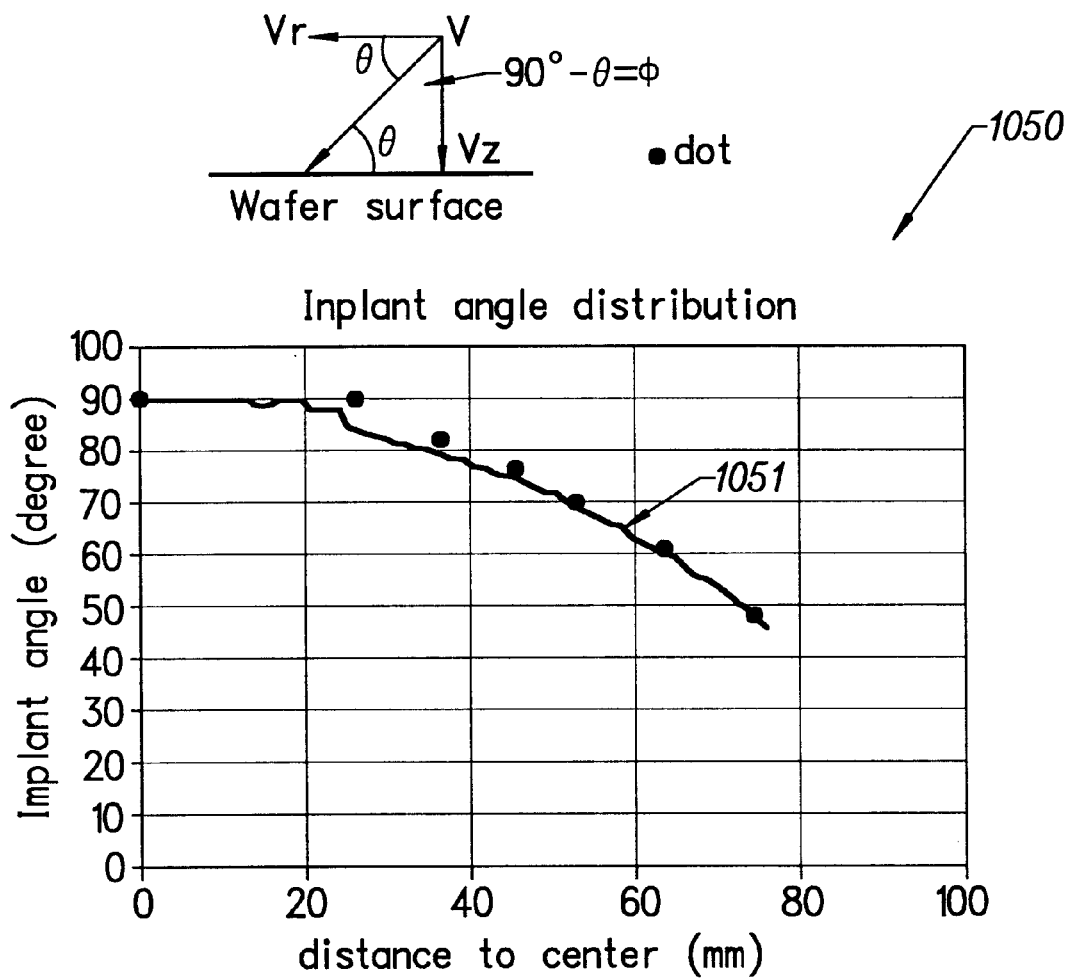

Our experiments have also shown that implant profile uniformity depends upon implant angle. As merely an example, an implant angle variation of twelve degrees from normal causes an implant depth or thickness variation of about 2.2%. In some cases, we found that an implant angle variation of ten degrees and less produces a thickness variation of 2% and less. FIGS. 10A and 10B are simplified diagrams illustrating a potential distribution and an implant angle distribution for a conventional PIII apparatus, such as the WTI-2000 made by Waban Technologies, now Silicon Genesis Corporation, which is the present assignee. As shown in FIG. 10A, the potential distribution is plotted in a manner where the vertical axis represents an axial direction from the substrate, which is located at the zero point. The horizontal axis represents a radial direction where the center of the substrate is also at the zero point. The potential distribution 1000 includes a substrate 1003, which has an applied voltage differential of a negative 20 KeV. The plasma had a density of about $10^8$ ions/cm$^3$, which was predominantly hydrogen bearing particles. A plurality of electric field lines 1001 are shown. The conventional PIII apparatus produced the implant angle distribution 1050 of FIG. 10B. As shown, the distribution is plotted at 1051 where the vertical axis represents implant angle in degrees and the horizontal axis represents distance from the substrate center in millimeters. The substrate center is at zero and the edge of the substrate is at about 70 mm. The implant angle varies by about 45 degrees from the center to the edge of the substrate, which is undesirable for the present techniques for fabricating substrates.

Figure 10C:
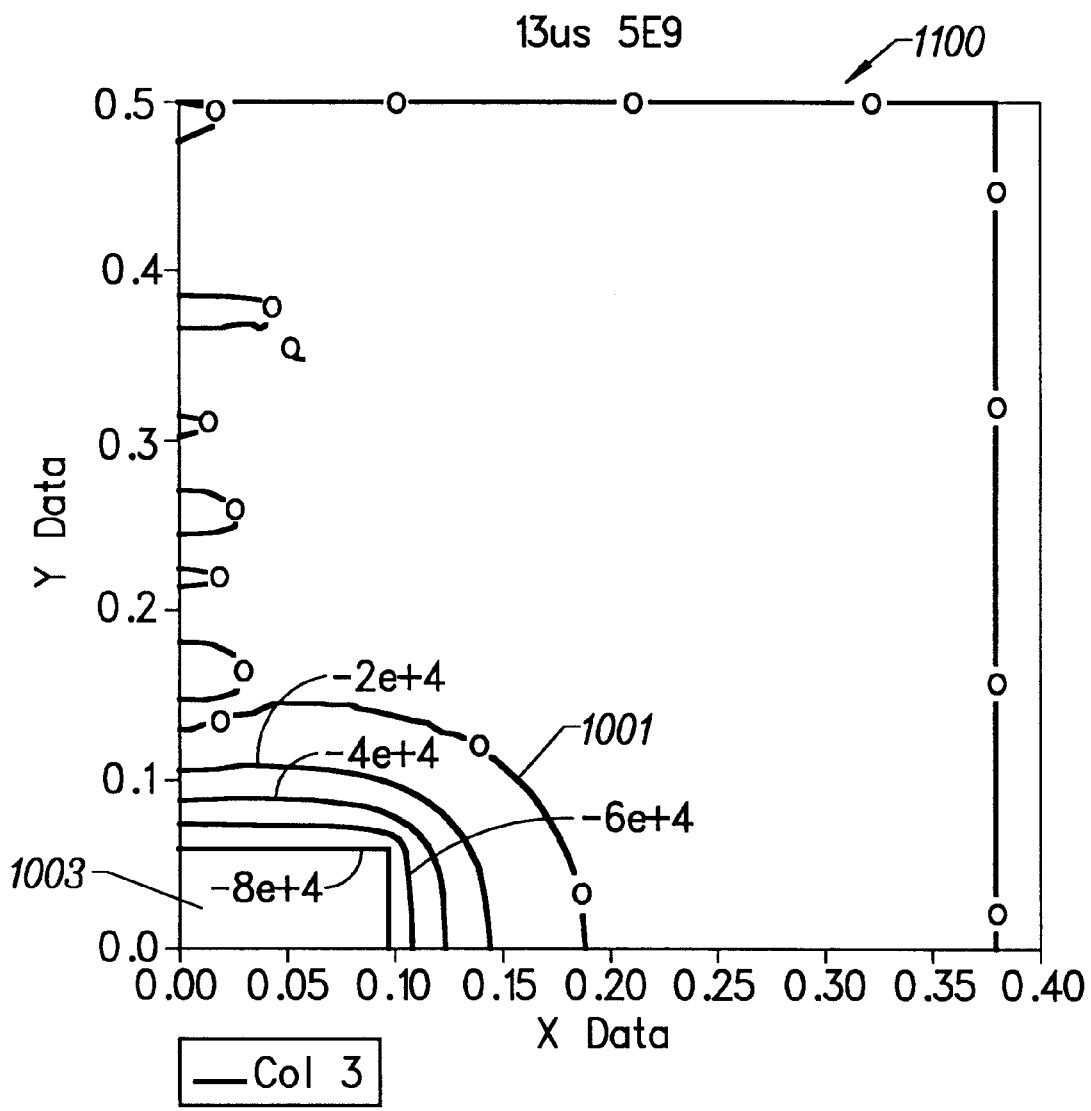
Figure 10F:
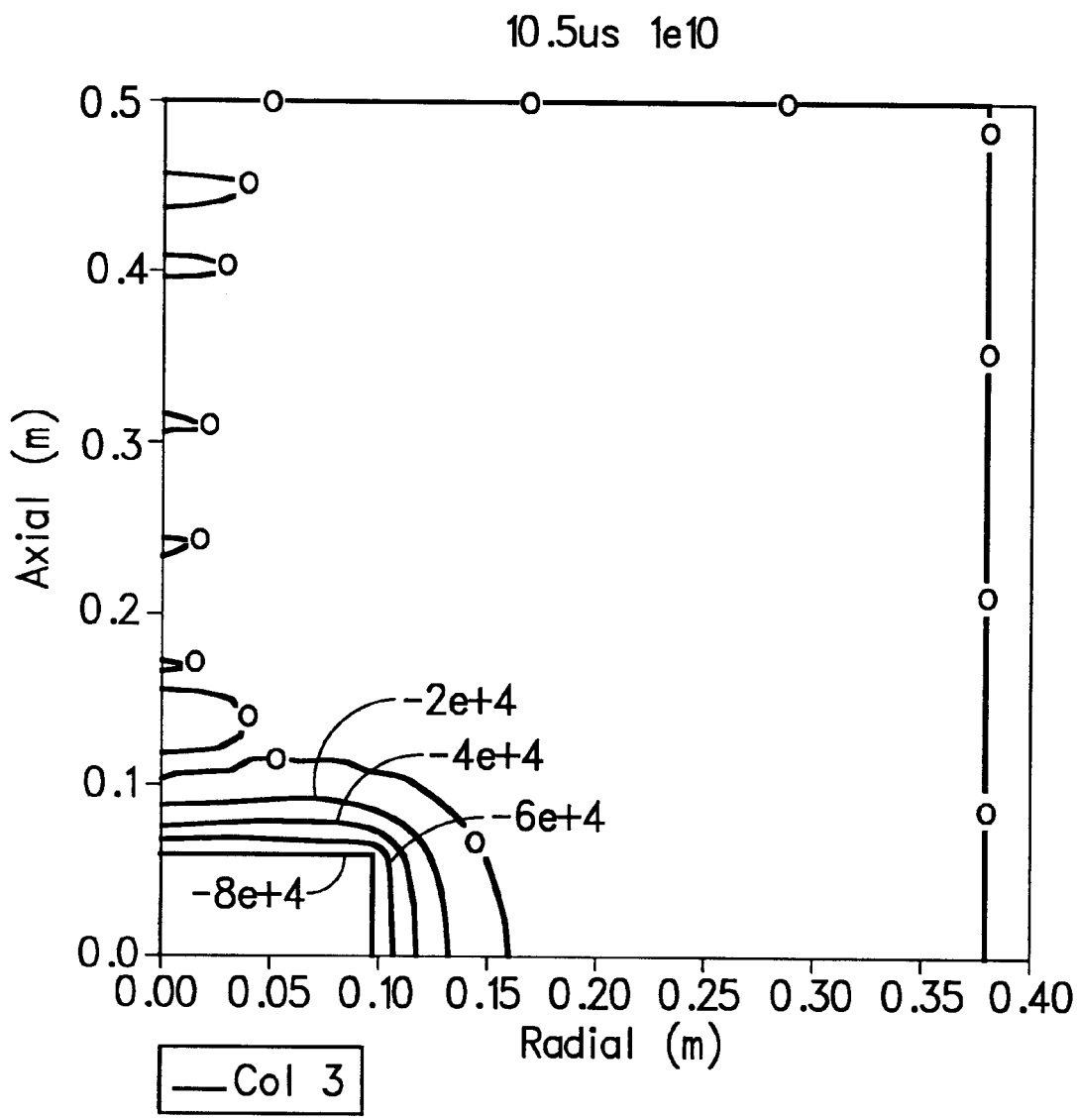
Figure 10H:
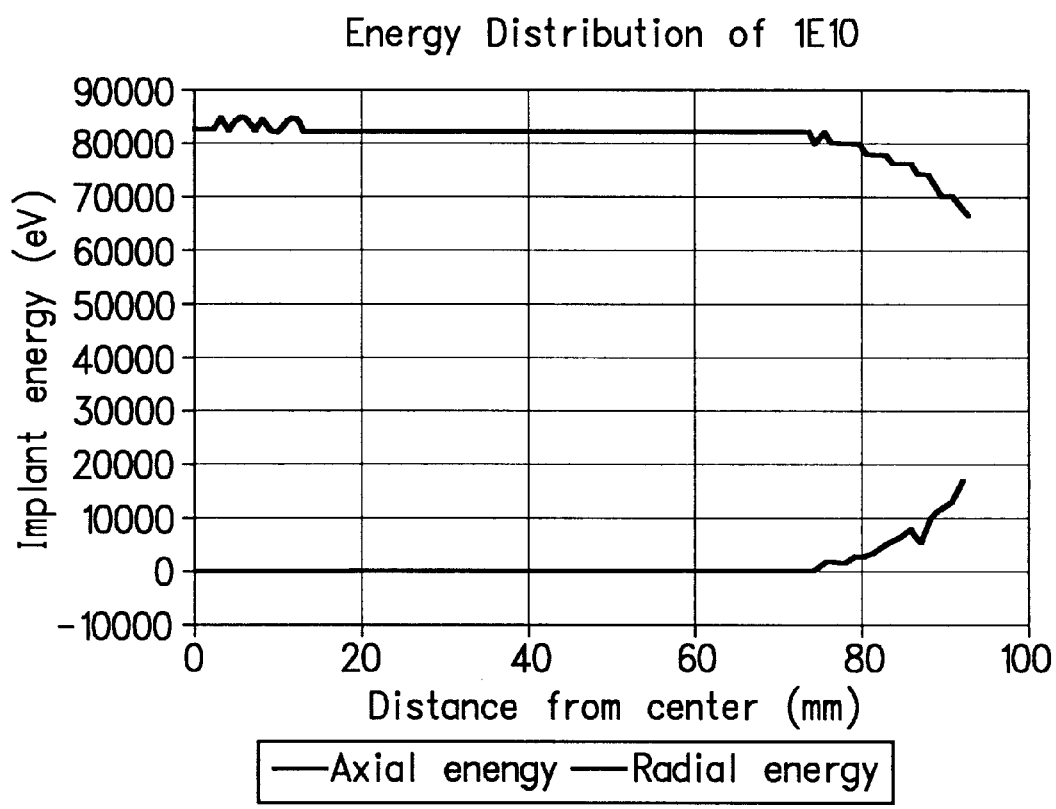

We adjusted the shape of the plasma sheath to improve uniformity of the implant angle. Here, it was desirable to produce an implant angle variation of less than the angle degrees, which we noted above. FIGS. 10C and 10D illustrate our findings at 1100 and 1150, respectively. Like reference numerals are used in this FIG. as the previous FIG. for easy referencing. As shown, the FIG. illustrate substrate 1003 and electric field lines 1001. The electric field potential lines, however, are much flatter near the top surface of the substrate than those potential lines in the previous FIG. Here, the plasma density for a hydrogen bearing plasma was increased to about $1 \times 10^9$ ions/cm$^3$. As shown at 1150 and 1200, repectively in FIGS. 10D and 10E, where the center of the substrate is at the zero point, and the edge of the substrate is at about 70 mm, both the energy distribution of the plasma and the implant angle distribution are substantially uniform. The substantially uniform distribution provides a substantially uniform implant distribution. We experienced an implant distribution uniformity variation, which was measured from the center to the edge, to be less than about 2%. We also performed additional experiments using a higher plasma density. As noted above, the plasma species were predominantly hydrogen bearing particles. Here, the plasma density was about $10^{10}$ atoms/cm$^3$. The implant energy was about 80 KeV, which yielded ion implant angle variation of about five degrees to correspond to a variation of thickness uniformity of 1% and less. The higher hydrogen plasma density and higher implant energy yielded the results shown in FIGS. 10F, 10G, and 10H. As shown, the higher plasma density yielded even a much more uniform distribution of potential, implant angle, and energy.

Of course, the above experiments are merely examples. These examples should not limit the scope of the general claims herein. One of ordinary skill in the art would recognize other variations, modifications, and alternatives. For example, the hydrogen bearing plasma can be replaced by a combination of other species, as well as a single species, such as oxygen and the like.

Although the above technique is described generally in terms of a PIII process, the process can be altered or modified. For example, the PIII process can be replaced by ion shower, or any other non-mass selected implantation technique. Additionally, the implantation process can be performed on more than one wafer, or a plurality of wafers for throughput purposes. One of ordinary skill in the art would recognize other variations, modifications, and alternatives.

While the above is a full description of the specific embodiments, various modifications, alternative constructions and equivalents may be used. For example, while the description above is in terms of a silicon wafer, it would be possible to implement the present invention with almost any type of substrate such as gallium nitride, silicon carbide, diamond, germanium, and the like. Additionally, the invention can be applied to devices such as three dimensional integrated circuits, monolithic integration of active circuit elements, photonic devices, sensors and actuators, and others. Therefore, the above description and illustrations should not be taken as limiting the scope of the present invention which is defined by the appended claims.

What is claimed is:

1. A method for implanting a substrate face using a plasma processing apparatus, said method comprising:

providing a substrate on a face of a susceptor, said face of said susceptor comprising a portion that extends outside of a diameter of said substrate, said substrate having an exposed face, said exposed face comprising a substrate diameter that extends from a first edge of said substrate to a second edge of said substrate across a length of said substrate;

forming a plasma sheath comprising hydrogen ions around said face of said substrate, said plasma sheath comprising a dark space distance that extends in a normal manner from said exposed face to an edge of said plasma sheath; and applying a voltage potential between said plasma sheath and said substrate to accelerate said hydrogen ions through said exposed face to a selected depth;

wherein said dark space distance and said substrate diameter comprise a ratio between said dark space distance and said substrate diameter, said ratio being at about one half and less within substantially a first portion of said exposed face;

wherein said substrate is maintained in an environment at a pressure of about 1 millitorr and less to reduce a possibility of a collision between at least one of said hydrogen ions and a neutral; and wherein said substrate is maintained at a temperature of about 205° Celsius and less to prevent a possibility of said implanted hydrogen ions from diffusing out of said substrate.

2. The method of claim 1 wherein said substrate is selected from a wafer, a silicon wafer, or a flat panel display.

3. The method of claim 1 wherein said substrate comprises a silicon wafer.

4. The method of claim 1 wherein said length is a widest length of said substrate.

5. The method of claim 1 wherein said portion is about twenty five percent or greater of said substrate diameter.

6. The method of claim 1 wherein said substrate is maintained in an environment of about one half a millitorr and less, but greater than about one fifth of a millitorr.

7. The method of claim 1 wherein said plasma sheath comprises a plasma density of at least $10^{10}$ ions/cm$^3$ of hydrogen bearing particles.

8. The method of claim 1 wherein said plasma sheath comprises a plasma density of at least $10^{11}$ ions/cm$^3$ of hydrogen bearing particles.

* * * * *